United States Patent [19]

Rairden, III

[11] E Re. 30,995

[45] Reissued Jul. 13, 1982

[54] HIGH INTEGRITY COCRAL(Y) COATED NICKEL-BASE SUPERALLOYS

[75] Inventor: John R. Rairden, III, Schenectady, N.Y.

[73] Assignee: General Electric Company, Schenectady, N.Y.

[21] Appl. No.: 166,126

[22] Filed: Jul. 7, 1980

Related U.S. Patent Documents

Reissue of:

[64] Patent No.: 4,101,715
Issued: Jul. 18, 1978
Appl. No.: 804,936
Filed: Jun. 9, 1977

[51] Int. Cl.[3] ..... B32B 15/20

[52] U.S. Cl. ..... 428/680; 428/937; 428/938

[58] Field of Search ..... 428/652, 668, 678, 680, 428/937, 938; 75/171; 427/34, 405

[56] References Cited

U.S. PATENT DOCUMENTS

| | | | |
|---|---|---|---|
| 3,676,085 | 7/1972 | Evans et al. | 428/678 |
| 3,873,347 | 3/1975 | Walker et al. | 117/71 M |
| 3,918,139 | 11/1975 | Felten | 75/171 |
| 3,928,026 | 12/1975 | Hecht et al. | 75/134 F |
| 3,957,454 | 5/1976 | Bessen | 428/937 |
| 3,976,436 | 8/1976 | Chang | 428/678 |
| 3,978,251 | 8/1976 | Stetson | 427/405 |
| 3,993,454 | 11/1976 | Giggins, Jr. et al. | 428/553 |
| 3,998,603 | 12/1976 | Rairden | 428/680 |
| 4,005,989 | 2/1977 | Preston | 428/678 |
| 4,018,569 | 4/1977 | Chang | 428/678 |
| 4,022,587 | 5/1977 | Wlodek | 75/171 |
| 4,034,142 | 7/1977 | Hecht | 428/678 |
| 4,101,713 | 7/1978 | Hirsh et al. | 428/678 |
| 4,144,380 | 3/1979 | Beltran et al. | 428/679 |

OTHER PUBLICATIONS

Wolf, P. C., "Vacuum Plasma Spray Process and Coatings", Trans. 9th Int. Thermal Spraying Conf., pp. 187-196, (1980).

Smith, R. W., et al., "Low Pressure Plasma Spray Coatings for Hot Corrossion Resistance", Trans. 9th Int. Thermal Spraying Conf., pp. 334-343, (1980).

Powell, C. F., et al., *Vapor Deposition,* John Wiley & Sons, Inc., pp. 242-246, (1966).

Kennedy, K., "Alloy Deposition from Single and Multiple Electron Beam Evaporation Sources", AVS 1968 Regional Symposia, pp. 1-8.

Messbacher, A., et al., "Vacuum Plasma Spraying of Protective Hot Gas Corrossion Coatings", Trans. 8th Int. Thermal Spray Conf. Amer. Weld Soc., pp. 25-37, (1976).

Rairden, J. R., et al., "The 3rd Conference on Gas Turbine Materials in a Marine Environment Coatings for Directional Eutectics", pp. 1-11, (9/76).

Rairden, J. R., et al., "Coatings for Protecting Nickel--Base TaC Eutectics Against Oxidation", *Thin Solid Films,* vol. 40, pp. 291-298, (1977).

Boone, D. H., et al., "Electron Beam Evaporation . . . ", *Thin Solid Films,* vol. 64, pp. 299-304, (1979).

Talboom, F. P., et al., *Evaluation of Advanced Superalloy Protection Systems,* NASA CR-72813 PWA-4055, pp. 1-9, 24, 46-56, (1970).

Foster, J. S., et al., "Vacuum Deposition of Alloys--Theoretical and Practical Considerations", *J. Vac. Sci.,* vol. 9, pp. 1379-1381, 1384, (1972).

Nimmagadda, R., et al., "Preparation of Alloy by Continuous Electron Beam Evaporation from a Single Rod-Fed Source", *J. Vac. Sci. Tech.,* vol. 9, (1972).

Boone, D. H., et al., "Some Effects of Structure . . . ", *J. Vac. Sci. Technol.,* vol. 11, pp. 641-646, (1974).

Rairden, J. R., et al., *Coatings for Directional Eutectics,* The 3rd Conf. on Gas Turbines in a Marine Environment Paper 4, pp. 1-11, (9/76).

Rairden, J. R., et al., *Coatings for Directional Eutectics,* NASA CR-135050, NAS 3-17815, pp. 1-73 and D-1 to ll, (7/25/76).

Jackson, M. R., et al., *Coatings for Directional Eutectics,* NASA SRD-74-047, NASA CR-134665, pp. 1-87, D1-12, (1/74).

*Primary Examiner*—Michael L. Lewis

*Attorney, Agent, or Firm*—Leo I. MaLossi; James C. Davis, Jr.

[57] ABSTRACT

A high temperature oxidation and corrosion resistant coated nickel-base superalloy article comprising (a) a nickel-base superalloy article, and [(b) a first] *adjacent thereto (b) a* CoCrAl(Y) coating *having a substantially uniform* composition [consisting essentially] *composed* of, on a weight basis, approximately 26–32% chromium, 3–9% aluminum, 0–1% yttrium, the rare earth elements, platinum or rhodium, and the balance [nickel] *cobalt and impurities ordinarily associated with the aforementioned constituents.*

2 Claims, 2 Drawing Figures

Co-22Cr-13Al-Y COATED IN-738 S.A.

Co-29 Cr-6Al-1Y COATED IN-738 S.A.

HIGH INTEGRITY COCRAL(Y) COATED NICKEL-BASE SUPERALLOYS

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to a high temperature oxidation and corrosion resistant coated nickel-base superalloy article comprising (a) a nickel-base superalloy article, and [(b) a first] *adjacent thereto (b) a* CoCrAl(Y) coating *having a substantially uniform* composition [consisting essentially] *composed* of, on a weight basis, approximately 26–32% chromium, 3–9% aluminum, 0–1% yttrium, the rare earth elements, platinum or rhodium, and the balance [nickel] *cobalt and impurities ordinarily associated with the aforementioned constituents.* An aluminide overcoating can be applied to the CoCrAl(Y) coated superalloys and constitute another embodiment of my invention.

2. Description of the Prior Art

Evans et al. in U.S. Pat. No. 3,676,085 describe coated nickel-base superalloys wherein the coating composition consists essentially of, on a weight basis, 15–40% chromium, 10–25% aluminum, 0.01–5% yttrium or the rare earth elements and the balance cobalt. Evans et al. [teache] *teach* that when the aluminum content of the CoCrAl(Y) coating is below about 10% there is insufficient aluminum present in the coating system to provide the desired long term durability in the coating.

Unexpectedly, I have found that nickel-base superalloys when coated with CoCrAl(Y) coatings having an aluminum content of less than 10% have outstanding physical and chemical properties, i.e. significant oxidation and corrosion resistance and high coating-substrate interface integrity. These outstanding properties are not associated with nickel-base superalloys when coated with the coating systems described by Evans et al. referenced above.

DESCRIPTION OF THE INVENTION

This invention embodies a high temperature oxidation and corrosion resistant coated nickel-base superalloy article comprising (a) a nickel-base superalloy article of manufacture, and [(b) a first] *adjacent thereto (b) a* CoCrAl(Y) coating *having a substantially uniform* composition [consisting essentially] *composed* of, on a weight basis, approximately 26–32% chromium, 3–9% aluminum, and 0–1% yttrium, the rare earth elements, platinum or rhodium, and the balance [nickel] *cobalt and impurities ordinarily associated with the aforementioned constituents.*

Figure 1:
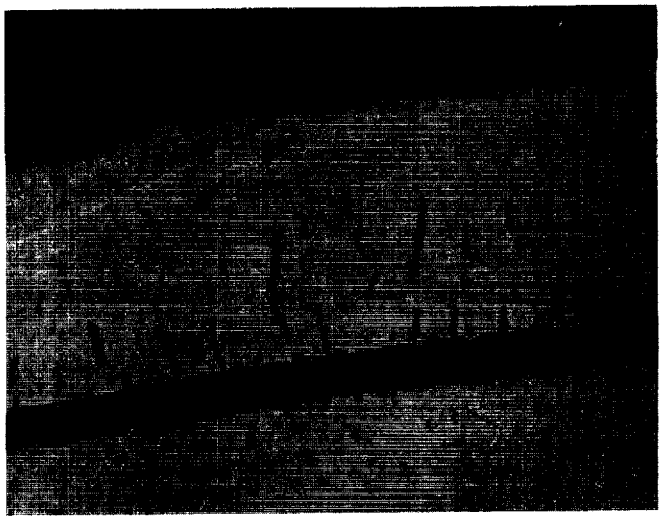

My invention is more clearly understood from the following description taken in conjunction with the accompanying drawings, where:

FIG. 1 is a photomicrograph (500X) of a CoCrAl(Y) coated nickel-base IN-738 superalloy having a coating composition of Evans et al. U.S. Pat. No. 3,676,085, i.e. Co-22Cr-13Al-1Y. This figure illustrates the low integrity of a CoCrAl(Y) coated nickel-base superalloy of the prior art, i.e. a coating which has a significant and a substantial tendency to separate from a superalloy substrate thereby failing to give the oxidation and corrosion resistant coating integrity desired for nickel-base superalloys.

Figure 2:
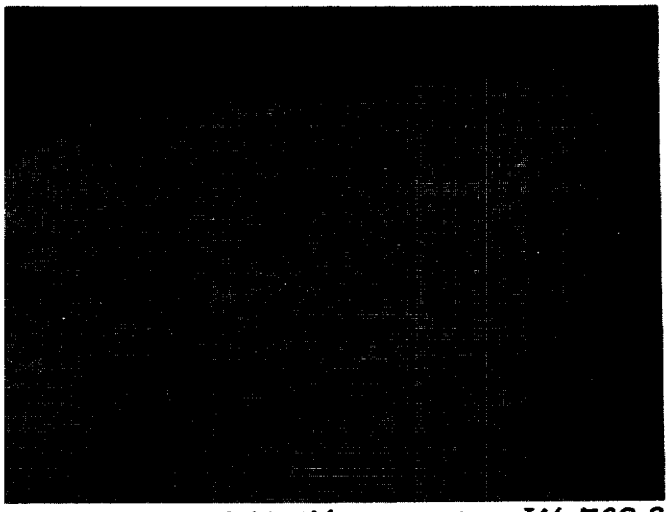

FIG. 2 is a photomicrograph (500X) of a CoCrAl(Y) coated nickel-base IN-738 superalloy having a coating composition of my invention, i.e. Co-29Cr-6Al-1Y.

This figure illustrates the high integrity of a CoCrAl(Y) coated nickel-base superalloy of my invention, i.e. a coating *of substantially uniform composition* which does not have a significant or substantial tendency to separate from a superalloy substrate thereby giving the oxidation and corrosion resistance coating integrity desired for nickel-base superalloys. The coated nickel-base superalloys of my invention have a thermal expansion coefficient value $\alpha$ as measured in inches $10^{-6}$ per inch per °F. (in./in./°F.) over a temperature range of (i) 100°–1200° F. of 8.45 to 9.05 in./in./°F. and (ii) 100° to 1740° F. of 9.45 to [10.5] *10.05* in./in./°F.

A presently preferred nickel-base superalloy employed in my invention "IN-738" is of the following general composition:

| Ingredient | IN-738 |
|---|---|
| C | 0.17 |
| Mn | 0.10 |
| Si | 0.30 |
| Cr | 16.0 |
| Ni | Bal. |
| Co | 8.5 |
| Mo | 1.75 |
| W | 2.6 |
| Cb | 0.9 |
| Ti | 3.4 |
| Al | 3.4 |
| B | 0.01 |
| Zr | 0.10 |
| Fe | 0.50 |
| Other | 1.75 Ta |

This superalloy has a thermal expansion coefficient value $\alpha$ measured in $10^{-6}$ in./in./°F. over the temperature ranges set out above of 8.7±0.1 and 9.7±0.1, respectively.

A presently preferred CoCrAl(Y) coating employed in my invention "GT-29" is of the following general composition: Co-29Cr-6Al-1Y. This coating has a thermal expansion coefficient $\alpha$ measured in $10^{-6}$ in./in./°F. over the temperature ranges set out above of 8.8±0.1 and 9.9±0.1, respectively.

*As is established hereinbelow, a successful substrate/coating combination within the teachings of this invention employs IN-738 as the nickel-base superalloy and Co-29Cr-6Al-1Y as the coating composition. The approximate percent difference in coefficients of thermal expansion successfully tolerated in the tests described are calculated from the data set forth above as follows:*

| TEC* IN-738 | Co-29Cr-6Al-1Y | MAX. TEC DIFFERENCE | % DIFFERENCE |
|---|---|---|---|
| 8.7 ± 0.1 | 8.8 ± 0.1 | 8.9 − 8.6 = 0.3 | $\frac{0.3}{8.6} \times 100 = 3.49$ |

-continued

| TEC* IN-738 | Co-29Cr-6Al-1Y | MAX. TEC DIFFERENCE | % DIFFERENCE |
|---|---|---|---|
| 9.7 ± 0.1 | 9.9 ± 0.1 | 10.0 − 9.6 = 0.4 | $\frac{0.4}{9.6} \times 100 = 4.17$ |

*Thermal Expansion Coefficient $10^{-6}$ in./in./°F.

*Thus, in sum, this set of calculations shows that the combination of these materials had a maximum TEC difference of about 4 percent.*

The nickel-base superalloys and CoCrAl(Y) alloys employed in my invention can be prepared by any method well-known to those skilled.

The CoCrAl(Y) coatings can be applied to the nickel-base superalloys by means, such as physical or chemical vapor deposition, or any other means well-known to those skilled in the art for the application of CoCrAl(Y) coatings to superalloys. Among the coating techniques that can be used are those described in Flame Spray Handbook, Volume III, by H. S. Ingham and A. P. Shepard, published by Metco, Inc., Westbury, Long Island, New York (1965), Vapor Deposition, edited by C. F. Powell, J. H. Oxley and J. M. Blocher, Jr., published by John Wiley & Sons, Inc., New York (1966), etc.

In general, the CoCrAl(Y) coated nickel-base superalloys can have any coating thickness sufficient to give a desired oxidation and corrosion resistance. Generally economic and effective coating thicknesses are 1–20 mils for most commercial applications. In preferred embodiments, where electron-beam techniques are employed the coating thicknesses range from 1–5 mils and where plasma flame spray techniques are employed the coating thicknesses range from 3–10 mils. In another preferred embodiment where an aluminide overcoating is employed, the aluminide overcoating—including any duplex heat treatment where the aluminide overcoating is heated for periods of time from 30 or 60 to 120 minutes at elevated temperatures of 850° to 1200° F. in air, argon, etc., for the purpose of diffusing aluminum into the CoCrAl(Y) coating—the [aluminuide] *aluminide* process is carried out in a manner which limits the aluminum penetration into the CoCrAl(Y) coating to a distance no nearer than a ½ mil measured from the interface of the nickel-base superalloy and the CoCrAl(Y) coating. This aluminide diffusion penetration limitation is essential to the integrity of the CoCrAl(Y) nickel-base superalloy interface since as indicated hereinbefore (as illustrated by FIG. 1) an increase in the aluminum content of the CoCrAl(Y) coating to levels of 10% or more deleterious affects the integrity of the coating composition.

My invention is further illustrated by the following examples:

EXAMPLE I

An experimental series was designed to study the expansion match characteristics of nickel-base superalloys and CoCrAl(Y) compositions as well as their oxidative and corrosion resistance.

Test specimen pins of IN-738 were prepared which had been lightly abraded with a No. 3 alumina powder. The resulting pins were 4.4 centimeters long and 0.25 cm. in diameter. A series of CoCrAl(Y) ingots having the compositions set out hereafter in Table I were electron-beam deposited on the abraded IN-738 pin substrates at a deposition rate of approximately 0.1 mils per minute while the pins were rotated at approximately 10 revolutions per minute. The coatings were deposited at various pins substrate temperatures, e.g. 1022° F., 1292° F., 1562° F. and 1832° F. The CoCrAl(Y) coated pins were thermal cycled during deposition over a temperature range of from approximately 1832° F. to 70° F. (room temperature).

[Mellographic] *Metallographic* examination via photomicrographs—illustrated by FIGS. 1 and 2—shows that the CoCrAl(Y) compositions of Evans et al. are not suited to nickel-base superalloys defined herein since high aluminum CoCrAl(Y) coatings as deposited on the nickel-base superalloy IN-738 separate from the substrate during thermal cycling over a temperature range of from 1832°–70° F.

TABLE I

| Inventors | Compositions | Associated Photo-micrographs |
|---|---|---|
| Evans et al., Prior Art | Co-18Cr-17Al-1Y | — |
| Compositions | Co-22Cr-13Al-1Y | FIG. 1 |
| | Co-26Cr-9Al-1Y | — |
| Rairden's, This Invention's | Co-29Cr-6Al-1Y | FIG. 2 |
| Compositions (RD-7240) | Co-30Cr-9Al-1Y | — |
| | Co-32Cr-3Al-1Y | |

EXAMPLE II

Another series of CoCrAl(Y) coated IN-738 pin samples were prepared as described in Example I above—having the coating compositions set out hereafter in Table II—were subjected to a burner rig test which simulated conditions used in a marine gas turbine engine under highly corrosive conditions. The test was run to coating failure using a diesel fuel containing 1% by weight of sulfur and 467 parts per million sea salt at a temperature 1600° F. coupled with thermocycling to room temperature 3 to 5 times per week. The CoCrAl(Y) coated IN-738 samples were evaluated and characterized according to hours to failure, failure being defined as a condition wherein the results of the burner rig corrosion test conditions set out in Table II hereafter:

TABLE II

| Inventors | Compositions | Hours to Failure* |
|---|---|---|
| Evans et al. | Co-22Cr-13Al-1Y | 605 |
| Rairden's | Co-32Cr-3Al-1Y | 1235 |
| | Co-29Cr-6Al-1Y | 1675 |
| | Co-30Cr-9Al-1Y | 2431 |
| | Co-26Cr-9Al-1Y | 1594 |

*Failure being defined as the approximate number of hours of test prior to the formation of an observable bulky, green, nickel-bearing oxide which indicates that the coating has been penetrated under the burner rig test conditions.

I claim:

1. A high temperature oxidation and corrosion resistant coated nickel-base superalloy article [having a thermal expansion coefficient value in inches per inch per °F. measured over a temperature range of (i) 100°–1200° F. of from 8.45 to 9.05, and (ii) 100°–1740° F. of from 9.45 to 10.05;] *characterized by high coating-substrate interface integrity, said article* comprising:

(a) a nickel-base superalloy, and (b) a [first] CoCrAl(Y) coating *providing the outer surface of said article, said coating having a substantially uniform* composition [consisting essentially] *composed* of, on a weight basis, approximately 26–32 percent chromium, 3–9 percent aluminum, and 0–1 percent yttrium, other rare earth elements, platinum or rhodium, and the balance cobalt *and impurities ordinarily associated with the aforementioned constituents*[.], *said nickel-base superalloy and said CoCrAl(Y) coating having substantially matching thermal expansion coefficient values with the maximum difference between the thermal expansion coefficient value of said substrate and the thermal expansion coefficient value of said coating being about 4 percent over a temperature range from 100° F. to 1740° F.*

2. A claim 1 article, wherein

[(a) said nickel-base superalloy consists essentially of, on a weight basis,]

| Ingredient | IN-738 |
|---|---|
| C | 0.17 |
| Mn | 0.20 |
| Si | 0.30 |
| Cr | 16.0 |
| Ni | Bal. |

-continued

| Ingredient | IN-738 |
|---|---|
| Co | 8.5 |
| Mo | 1.75 |
| W | 2.6 |
| Cb | 0.9 |
| Ti | 3.4 |
| Al | 3.4 |
| B | 0.01 |
| Zr | 0.10 |
| Fe | 0.50 |
| Other | 1.75 Ta |

[(b) said first] *the* coating contains 29% chromium, 6% aluminum, 1% yttrium and the balance cobalt.

[3. A claim 2 article, further comprising (c) an overcoating of aluminum.]

[4. A claim 3 article, wherein (b) said first coating has a thickness of about 1–20 mils, (c) said second coating penetrates the first coating to a depth no nearer than ½ mil measured from the interface of the nickel-base superalloy and first coating.]

[5. A claim 4 article, wherein (b) said first coating is deposited by physical vapor deposition and the coating thickness is about 1–5 mils, (c) said second coating is deposited by chemical vapor deposition.]

[6. The claim 4 article, wherein (b) said first coating is deposited by plasma spraying and has a coating thickness of 3–10 mils.]

* * * * *

UNITED STATES PATENT AND TRADEMARK OFFICE

CERTIFICATE OF CORRECTION

PATENT NO. : Re. 30,995

DATED : July 13, 1982

INVENTOR(S) : John R. Rairden, III

It is certified that error appears in the above—identified patent and that said Letters Patent is hereby corrected as shown below:

Column 5, line 23 through column 6, line 14:

2. A claim 1 article, wherein

[(a) said nickel-base superalloy consists essentially of, on a weight basis,

| Ingredient | IN-738 |
|---|---|
| C | 0.17 |
| Mn | 0.20 |
| Si | 0.30 |
| Cr | 16.0 |
| Ni | Bal. |
| Co | 8.5 |
| Mo | 1.75 |
| W | 2.6 |
| Cb | 0.9 |
| Ti | 3.4 |
| Al | 3.4 |
| B | 0.01 |
| Zr | 0.10 |
| Fe | 0.50 |
| Other | 1.75 Ta |

(b) said first] *the* coating contains 29% chromium, 6% aluminum, 1% yttrium and the balance cobalt.

Signed and Sealed this

*Twenty-sixth* Day of *October 1982*

[SEAL]

*Attest:*

GERALD J. MOSSINGHOFF

*Attesting Officer*

*Commissioner of Patents and Trademarks*